(12) United States Patent
Sunohara et al.

(10) Patent No.: US 12,205,841 B2
(45) Date of Patent: Jan. 21, 2025

(54) ELECTROSTATIC CHUCK AND SUBSTRATE FIXING DEVICE

(71) Applicant: SHINKO ELECTRIC INDUSTRIES CO., LTD., Nagano (JP)

(72) Inventors: Masahiro Sunohara, Nagano (JP); Ken Sato, Nagano (JP); Tatsuya Nakamura, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 320 days.

(21) Appl. No.: 17/850,191

(22) Filed: Jun. 27, 2022

(65) Prior Publication Data
US 2023/0005779 A1     Jan. 5, 2023

(30) Foreign Application Priority Data
Jun. 30, 2021   (JP) .................................. 2021-109522

(51) Int. Cl.
*H01T 23/00*    (2006.01)
*H01L 21/683*   (2006.01)

(52) U.S. Cl.
CPC ............................. *H01L 21/6833* (2013.01)

(58) Field of Classification Search
None
See application file for complete search history.

(56) References Cited

U.S. PATENT DOCUMENTS

| | | |
|---|---|---|
| 5,880,924 A | 3/1999 | Kumar et al. |
| 9,101,038 B2 | 8/2015 | Singh et al. |
| 2002/0158328 A1* | 10/2002 | Hiramatsu .......... H01L 21/6833 257/700 |
| 2004/0040665 A1 | 3/2004 | Mizuno et al. |
| 2004/0097359 A1* | 5/2004 | Hiramatsu .............. C04B 35/46 264/619 |
| 2006/0158823 A1 | 7/2006 | Mizuno et al. |
| 2007/0297118 A1 | 12/2007 | Fujii |
| 2009/0059462 A1 | 3/2009 | Mizuno et al. |
| 2009/0122459 A1 | 5/2009 | Mizuno et al. |
| 2010/0046134 A1 | 2/2010 | Mizuno et al. |
| 2011/0013338 A1 | 1/2011 | Fujii |

(Continued)

FOREIGN PATENT DOCUMENTS

| | | |
|---|---|---|
| JP | 2001-525616 A | 12/2001 |
| JP | 2004-22889 A | 1/2004 |

(Continued)

OTHER PUBLICATIONS

Japanese Office Action dated Apr. 4, 2023, Japanese Application No. 2021-109522, English translation included, 6 pages.

(Continued)

*Primary Examiner* — Stephen W Jackson
(74) *Attorney, Agent, or Firm* — Rankin, Hill & Clark LLP

(57) ABSTRACT

An electrostatic chuck includes a ceramic plate, an adsorption electrode, a ground electrode, and a wiring. The adsorption electrode is built-in near one surface of the ceramic plate. The ground electrode is arranged in the ceramic plate between the other surface of the ceramic plate and the adsorption electrode, and can be connected to a ground potential. The wiring is connected to the ground electrode in the ceramic plate and extends to the one surface of the ceramic plate.

13 Claims, 12 Drawing Sheets

(56) References Cited

U.S. PATENT DOCUMENTS

| | | | |
|---|---|---|---|
| 2013/0155569 | A1 | 6/2013 | Suuronen et al. |
| 2020/0165723 | A1* | 5/2020 | Fujisato ................ C23C 16/505 |
| 2022/0108877 | A1 | 4/2022 | Matsubara |
| 2023/0165723 | A1* | 6/2023 | Cantor ................ A61F 13/0276 |
| | | | 602/48 |

FOREIGN PATENT DOCUMENTS

| | | |
|---|---|---|
| JP | 2004-259805 A | 9/2004 |
| JP | 2013-542590 | 11/2013 |
| JP | 2014-013800 A | 1/2014 |
| JP | 2015-135960 A | 7/2015 |
| JP | 2022-60859 A | 4/2022 |
| KR | 2004-0032348 A | 4/2004 |
| WO | 2006/049085 A1 | 5/2006 |

OTHER PUBLICATIONS

Japanese Office Action issued on Feb. 27, 2024, Application No. 2023-077071; English machine translation included, 8 pages.

\* cited by examiner

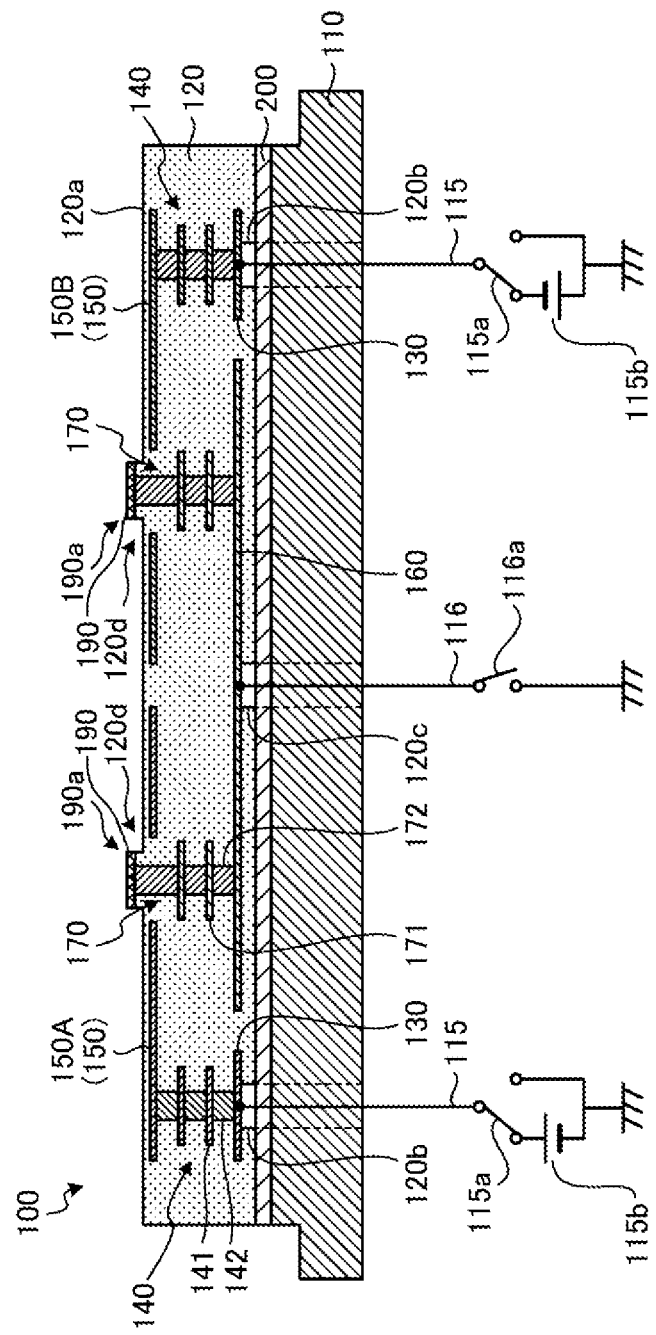

ELECTROSTATIC CHUCK AND SUBSTRATE FIXING DEVICE

CROSS-REFERENCE TO RELATED APPLICATIONS

This application is based on and claims the benefit of priority from prior Japanese patent application No. 2021-109522 filed on Jun. 30, 2021, the entire contents of which are incorporated herein by reference.

TECHNICAL FIELD

The present invention relates to an electrostatic chuck and a substrate fixing device.

BACKGROUND ART

A substrate fixing device configured to adsorb and hold a substrate such as a wafer when manufacturing, for example, a semiconductor component is provided with an electrostatic chuck (ESC) constituted using a ceramic plate having a built-in adsorption electrode. The substrate fixing device has a structure where the electrostatic chuck is fixed to a base plate, and is configured to apply a voltage to the adsorption electrode built in the ceramic plate, thereby adsorbing the substrate on the electrostatic chuck by using an electrostatic force. By adsorbing and holding the substrate on the electrostatic chuck, processes such as microfabrication and etching on the substrate are efficiently performed.

CITATION LIST

Patent Literature

PTL 1: JP-A-2013-542590

SUMMARY OF INVENTION

In the meantime, in the substrate fixing device, when the process on the substrate ends, the application of the voltage to the adsorption electrode is stopped to release the electrostatic force in the electrostatic chuck, and the substrate is detached from an adsorption surface of the electrostatic chuck by using a lift pin or the like.

However, even when the application of the voltage to the adsorption electrode is stopped, electric charges may remain on the adsorption surface of the electrostatic chuck. When the adsorption surface is electrically charged, an adsorption force corresponding to the electric charges remains between the adsorption surface and the substrate, which may hinder the detachment of the substrate from the adsorption surface.

Aspect of non-limiting embodiments of the present disclosure is to provide an electrostatic chuck and a substrate fixing device capable of facilitating detachment of a substrate.

In one aspect, an electrostatic chuck of the present disclosure includes a ceramic plate, an adsorption electrode, a ground electrode, and a wiring. The adsorption electrode is built-in near one surface of the ceramic plate. The ground electrode is arranged in the ceramic plate between the other surface of the ceramic plate and the adsorption electrode, and can be connected to a ground potential. The wiring is connected to the ground electrode in the ceramic plate and extends to the one surface of the ceramic plate.

According to one aspect of the electrostatic chuck of the present disclosure, an effect that detachment of the substrate can be facilitated is achieved.

BRIEF DESCRIPTION OF DRAWINGS

FIG. 12 is a schematic view showing a cross section of a substrate fixing device according to a modified embodiment.

DESCRIPTION OF EMBODIMENTS

Hereinafter, embodiments of the electrostatic chuck and the substrate fixing device of the present disclosure will be described in detail with reference to the drawings. Note that, the disclosed technology is not limited to the embodiments.

First Embodiment

Figure 1:
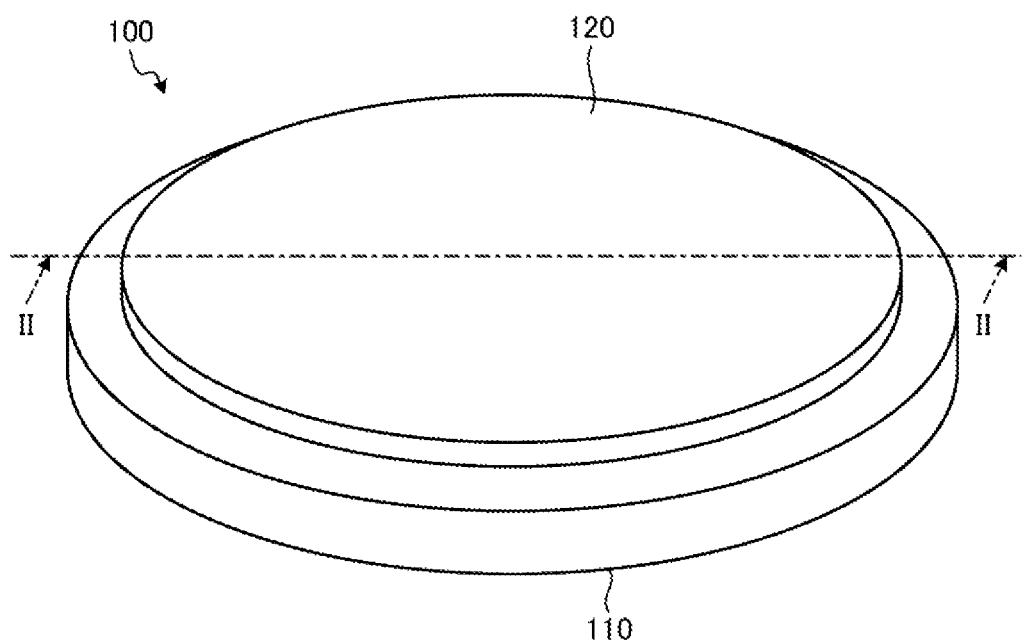
FIG. 1 is a perspective view showing a configuration of a substrate fixing device according to a first embodiment.

FIG. 1 is a perspective view showing a configuration of a substrate fixing device 100 according to a first embodiment. The substrate fixing device 100 shown in FIG. 1 has a structure where an electrostatic chuck 120 is bonded to a base plate 110.

The base plate 110 is a circular member of metal such as aluminum, for example. The base plate 110 is a base member for fixing the electrostatic chuck 120. The base plate 110 is attached to a semiconductor manufacturing device, for example, and causes the substrate fixing device 100 to function as a semiconductor holding device configured to hold a wafer. Note that, the base plate 110 may also be attached to, for example, an exposure device, a machining device, a bonding device, a measuring device, an inspection device, or the like, in addition to the semiconductor manufacturing device, and may cause the substrate fixing device 100 to function as a semiconductor holding device.

The electrostatic chuck 120 is bonded to the base plate 110 and is configured to adsorb a target object such as a wafer by using an electrostatic force. The electrostatic chuck 120 is a circular member having a diameter smaller than that of the base plate 110, and one surface thereof is bonded to a center of the base plate 110. The electrostatic chuck 120 is configured to adsorb a target object such as a wafer on an adsorption surface on an opposite side to a bonding surface bonded to the base plate 110. That is, the electrostatic chuck 120 is made of a ceramic having an adsorption electrode built-in near the adsorption surface, and is configured to adsorb a target object on the adsorption surface by an electrostatic force when a voltage is applied from the base plate 110 to the adsorption electrode.

Figure 2:
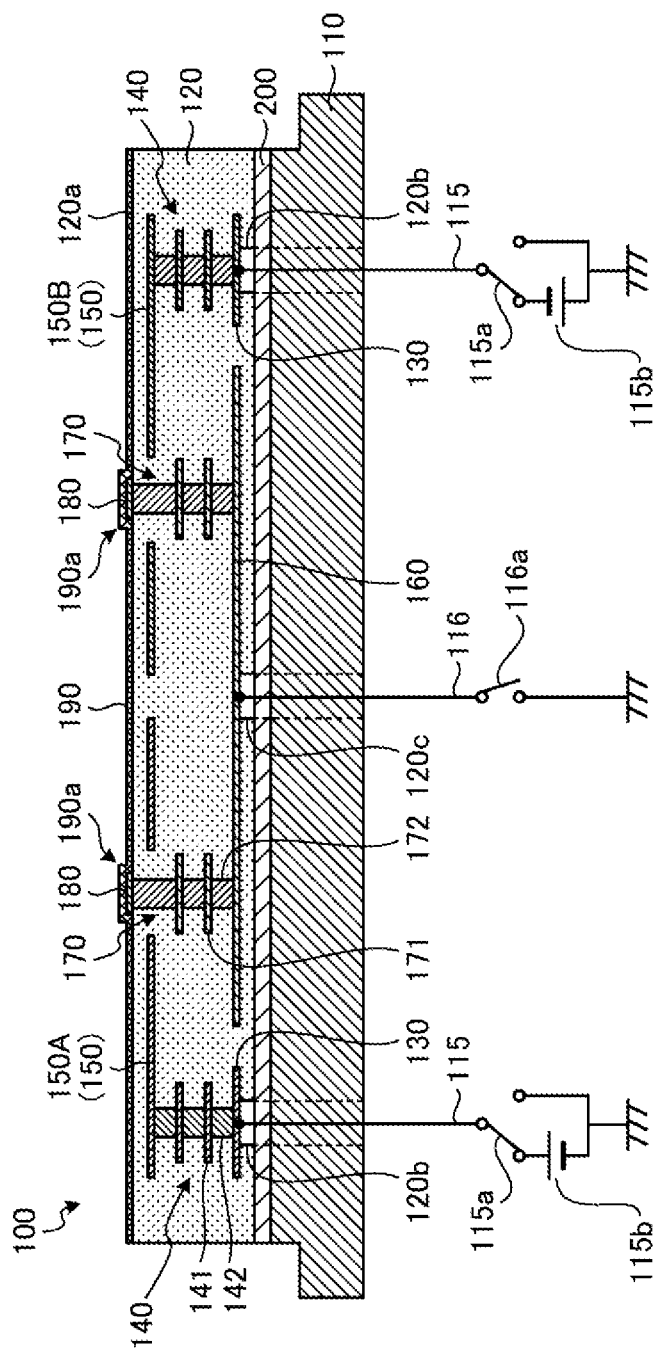
FIG. 2 is a schematic view showing a cross section of the substrate fixing device according to the first embodiment.

FIG. 2 is a schematic view showing a cross section of the substrate fixing device 100 according to the first embodiment. In FIG. 2, a cross-sectional view taken along an II-II line in FIG. 1 is schematically shown. As shown in FIG. 2, the substrate fixing device 100 is constituted by bonding the electrostatic chuck 120 to the base plate 110 via an adhesive layer 200. In the below, for convenience, a direction from the base plate 110 toward the electrostatic chuck 120 is described as an upward direction, and a direction from the electrostatic chuck 120 toward the base plate 110 is described as a downward direction. However, the substrate fixing device 100 may be manufactured and used at an arbitrary posture such as an upside down posture.

The base plate 110 is a member having a thickness of 5 to 100 mm and made of metal such as aluminum, for example. The base plate 110 is provided with a power supplying line 115 to penetrate through the same. The power supplying line 115 is formed, for example, in a shape of a pin, penetrates through the adhesive layer 200, and is connected to a power supplying pad 130 of the electrostatic chuck 120. The power supplying line 115 is in contact with the power supplying pad 130, so that power is supplied to a wiring 140 in the electrostatic chuck 120. A switch 115a is connected to the power supplying line 115, The switch 115a can switch connection between the power supplying line 115 and a positive electrode or a negative electrode of a DC power supply 115b and connection between the power supplying line 115 and a ground potential.

In addition, the base plate 110 is provided with a ground line 116 to penetrate through the same. The ground line 116 is switched between a state connected to the ground potential and a state not connected to the ground potential by a switch 116a. The ground line 116 is formed, for example, in a shape of a pin, penetrates through the adhesive layer 200, and is connected to a ground electrode 160 of the electrostatic chuck 120. The ground line 116 connected to the ground electrode 160 is connected to the ground potential, so that the ground electrode 160 is connected to the ground potential.

The electrostatic chuck 120 has a built-in wiring 140 that can be energized, and is made of a ceramic plate obtained by firing aluminum oxide, for example. A thickness of the electrostatic chuck 120 is, for example, about 1 to 20 mm. A cavity 120b, which is a concave portion capable of accommodating the power supplying line 115 of the base plate 110, is formed at an outer peripheral part of a lower surface of the electrostatic chuck 120, and a lower surface of the power supplying pad 130 is exposed to the cavity 120b, A tip end of the power supplying line 115 is in contact with the lower surface of the power supplying pad 130, so that power is supplied from the base plate 110 to the wiring 140 in the electrostatic chuck 120.

An upper surface of the electrostatic chuck 120 is an adsorption surface 120a for adsorbing a target object. An adsorption electrode 150 for generating an electrostatic force is built-in near the adsorption surface 120a. The power supplying pad 130 in contact with the power supplying line 115 is built-in near the lower surface of the electrostatic chuck 120 on an opposite side to the adsorption surface 120a. The power supplying pad 130 and the adsorption electrode 150 are electrically connected to each other by the wiring 140 constituted by laminating a plurality of connection pads 141 and vias 142. That is, a plurality of layers of connection pads 141 are arranged between the power supplying pad 130 in contact with the power supplying line 115 and the adsorption electrode 150. The power supplying pad 130 and the connection pad 141, the adjacent connection pads 141, and the connection pad 141 and the adsorption electrode 150 are connected therebetween by the vias 142, respectively.

In the configuration shown in FIG. 2, the adsorption electrode 150 is a bipolar electrode and is separated into a first electrode 150A and a second electrode 150B. The first electrode 150A is a positive electrode that can be connected to the positive electrode of the DC power supply 115b, and the second electrode 150B is a negative electrode that can be connected to the negative electrode of the DC power supply 115b. The first electrode 150A and the second electrode 150B each consist of a plurality of semicircular arc-shaped conductor patterns arranged concentrically and are arranged inside the electrostatic chuck 120 so that chords-side of the semicircular arcs face each other.

The wiring 140 is arranged in two sets on the left and right according to the first electrode 150A and the second electrode 150B of the adsorption electrode 150, and each wiring 140 is formed by laminating two layers of connection pads 141 between the power supplying pad 130 and the adsorption electrode 150.

The connection pad 141 is formed of a conductor such as tungsten as a material. In addition, the via 142 is formed by filling a via hole formed between the connection pads 141 of the adjacent layers with a conductor such as molybdenum.

The ground electrode 160 is arranged in the electrostatic chuck 120 between the lower surface of the electrostatic chuck 120 and the adsorption electrode 150. The ground electrode 160 is made of metal such as tungsten, has a circular pattern having a diameter of about 270 to 300 mm and a thickness of about 10 to 50 μm, and is configured to be connectable to the ground potential. Specifically, a cavity 120c, which is a concave portion capable of accommodating an end portion of the ground line 116 of the base plate 110, is formed at a central part of the lower surface of the electrostatic chuck 120, and a lower surface of the ground electrode 160 is exposed to the cavity 120c. An end portion of the ground line 116 connected to the ground potential is connected to the lower surface of the ground electrode 160, so that the ground electrode 160 is connected to the ground potential. For example, when adsorbing a target object on the adsorption surface 120a of the electrostatic chuck 120, the power supplying line 115 is connected to the positive or negative electrode of the DC power supply 115b by the switch 115a, and the ground line 116 is disconnected from the ground potential by the switch 116a. Thereby, the ground electrode 160 is disconnected from the ground potential. On the other hand, when detaching the target object from the adsorption surface 120a, the power supplying line 115 is connected to the ground potential by the switch 115a, and the ground line 116 is connected to the ground potential by the switch 116a. Thereby, the ground electrode 160 is connected to the ground potential.

A wiring 170 formed by laminating a plurality of connection pads 171 and vias 172 is connected to the ground electrode 160. The wiring 170 extends to the adsorption surface 120a of the electrostatic chuck 120. The ground electrode 160 and the adsorption surface 120a are electrically connected to each other by the wiring 170 constituted by laminating the plurality of connection pads 171 and vias 172. That is, the plurality of layers of connection pads 171 are arranged between the ground electrode 160 in contact with the ground line 116 and the adsorption surface 120a. The ground electrode 160 and the connection pad 171, the adjacent connection pads 171, and the connection pad 171 and the adsorption surface 120a are connected therebetween by the vias 172, respectively. An end surface of the via 172 connecting the connection pad 171 and the adsorption surface 120a therebetween, i.e., an end surface of the wiring 170 is exposed from the adsorption surface 120a.

In the configuration shown in FIG. 2, the wiring 170 is arranged in two sets on the left and right according to the first electrode 150A and the second electrode 150B of the adsorption electrode 150, and each wiring 170 is formed by laminating two layers of connection pads 171 between the ground electrode 160 and the adsorption surface 120a.

The connection pad 171 is formed of a conductor such as tungsten as a material. In addition, the via 172 is formed by filling a via hole formed between the connection pads 171 of the adjacent layers with a conductor such as molybdenum.

In this way, the ground electrode 160 connectable to the ground potential is arranged in the electrostatic chuck 120, and the wiring 170 extending to the adsorption surface 120a is connected to the ground electrode 160. For this reason, when application of a voltage to the adsorption electrode 150 is stopped, electric charges remaining on the adsorption surface 120a can be escaped to the ground electrode 160 via the wiring 170. That is, since an amount of the electric charges remaining on the adsorption surface 120a is reduced, it is possible to reduce generation of an adsorption force between the adsorption surface 120a and the wafer due to electrification on the adsorption surface 120a. As a result, detachment of the water from the adsorption surface 120a can be facilitated.

The ground electrode 160 is arranged at a position in the electrostatic chuck 120 where a distance from the adsorption electrode 150 is the same as that of the power supplying pad 130 from the adsorption electrode, Thereby, a length of the power supplying line 115 in contact with the lower surface of the power supplying pad 130 and a length of the ground line 116 in contact with the lower surface of the ground electrode 160 can be matched, which can simplify a manufacturing process of the electrostatic chuck 120.

The end surface of the wiring 170 exposed from the adsorption surface 120a of the electrostatic chuck 120 is covered with a metal layer 180. The metal layer 180 is formed by an electrolytic plating method or an electroless plating method using metal such as nickel or a nickel-gold alloy as a material. The adsorption surface 120a of the electrostatic chuck 120 and the metal layer 180 are covered with an insulating film 190. The insulating film 190 is formed by thermal spraying, sputtering or CVD (Chemical Vapor Deposition) using, for example, aluminum oxide, yttrium oxide, diamond-like carbon or the like as a material. The insulating film 190 forms an emboss 190a that protrudes in a direction away from the adsorption surface 120a of the electrostatic chuck 120 at a position of the metal layer 180. The emboss 190a is formed by performing blasting on a region of the insulating film 190 that does not overlap the metal layer 180, after forming the insulating film 190 and polishing an upper surface of the insulating film 190. For example, the emboss 190a has a diameter of about 100 μm to 2 mm and a height of about 5 to 20 μm, and the metal layer 180 has a height of 1 to 20 μm. The height of the emboss 190a is a distance from the upper surface of the portions which covers the adsorption surface 120a of the insulating film 190 to an upper surface of the emboss 190a which covers the metal layer 180.

In this way, the end surface of the wiring 170 exposed from the adsorption surface 120a of the electrostatic chuck 120 is covered with the metal layer 180, and the insulating film 190 forms the emboss 190a at the position of the metal layer 180, whereby a contact area between the adsorption surface 120a and the wafer can be reduced. For this reason, it is possible to further reduce generation of the adsorption force between the adsorption surface 120a and the wafer due to electrification on the adsorption surface 120a. As a result, detachment of the wafer from the adsorption surface 120a can be further facilitated.

Figure 3:
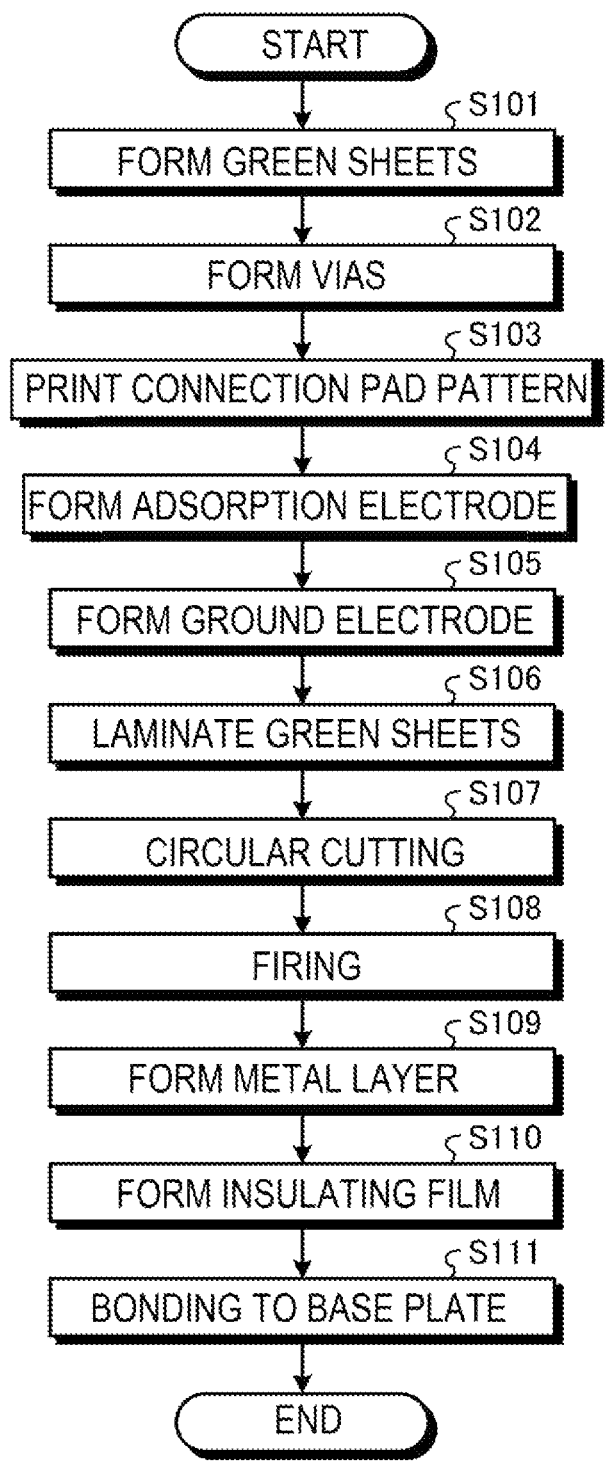
FIG. 3 is a flowchart of showing a manufacturing method of the substrate fixing device according to the first embodiment.

Next, a manufacturing method of the substrate fixing device 100 according to the first embodiment is described with reference to FIG. 3. FIG. 3 is a flowchart showing a manufacturing method of the substrate fixing device 100 according to the first embodiment.

First, a plurality of green sheets are produced so as to form an electrostatic chuck 120 (step S101). Specifically, a green sheet is produced by drying a slurry-like mixture obtained by mixing, for example, aluminum oxide and a predetermined auxiliary agent. The green sheet is, for example, a square sheet with a length and width of 500 mm×500 mm having a thickness of 0.7 mm.

Each green sheet is formed with vias 142 and 172 for connecting connection pads 141 and 171 of adjacent layers (step S102). Specifically, via holes penetrating through the green sheet are formed at positions where the connecting pads 141 and 171 of the adjacent layers overlap, and the via holes are filled with a conductor such as molybdenum to form vias 142 and 172. Note that, cavities 120b and 120c are also formed as through-holes penetrating through the green sheet, similarly to the via holes. That is, the through-holes of the plurality of laminated green sheets are connected to form openings, so that the cavities 120b and 120c are formed.

Patterns of the connection pads 141 and 171 are printed on the green sheets on which the vias 142 and 172 are formed (step S103). That is, the connection pads 141 and 171 are formed by printing a metal paste such as tungsten on the surfaces of the green sheets.

In addition, an adsorption electrode 150 is formed on the green sheet that is laminated in the vicinity of the adsorption surface 120a of the electrostatic chuck 120 (step S104). Further, a ground electrode 160 is formed on the green sheet that is laminated between a lower surface on an opposite side to the adsorption surface 120a of the electrostatic chuck 120 and the adsorption electrode 150 (step S105).

The green sheets on which the connection pads 141 and 171, the adsorption electrodes 150 and the ground electrodes 160 are formed are laminated in order in which the connection pads 141 and 171 of the adjacent layers, the adsorption electrode 150 and the ground electrode 160 are connected by the vias 142 and 172.(step S106). Thereby, the connection pads 141 of two layers are laminated to form a wiring 140 between a power supplying pad 130 and the adsorption electrode 150, and the connection pads 171 of two layers are laminated to form a wiring 170 between the ground electrode 160 and the adsorption surface 120a. On the adsorption surface 120a, an end surface of the wiring 170 is exposed. Then, the laminated body of the green sheets is cut into a circular shape according to a shape of a base plate 110 (step S107).

The laminated body cut into a circular shape is fired to become a ceramic in a firing furnace (step S108). A ceramic circular plate obtained by the firing becomes an electrostatic chuck 120. Then, the end surface of the wiring 170 exposed from the adsorption surface 120a of the electrostatic chuck 120 is formed with a metal layer 180 (step S109). That is, the metal layer 180 made of, for example, nickel or a nickel-gold alloy is formed on the end surface of the wiring 170 exposed from the adsorption surface 120a by an electrolytic plating method or an electroless plating method.

When the metal layer 180 is formed, an insulating film 190 is formed on the adsorption surface 120a of the electrostatic chuck 120 and a surface of the metal layer 180 (step S110). That is, the insulating film 190 made of, for example, aluminum oxide, yttrium oxide, diamond-like carbon, or the like is formed on the adsorption surface 120a of the electrostatic chuck 120 and the surface of the metal layer 180 by thermal spraying, sputtering or CVD.

Thereafter, the electrostatic chuck 120 is bonded to the metal base plate 110 by an adhesive layer 200 (step S111). For formation of the adhesive layer 200, a bonding material is used, for example. Thereby, a substrate fixing device 100 is completed.

As described above, an electrostatic chuck (for example, the electrostatic chuck 120) according to the first embodiment includes a ceramic plate, an adsorption electrode (for example, the adsorption electrode 150), a ground electrode (for example, the ground electrode 160), and a wiring (for example, the wiring 170). The adsorption electrode is built-in near one surface (for example, the adsorption surface 120a) of the ceramic plate. The ground electrode is arranged in the ceramic plate between the other surface of the ceramic plate and the adsorption electrode and can be connected to a ground potential. The wiring is connected to the ground electrode in the ceramic plate and extends to one surface of the ceramic plate. Thereby, according to the electrostatic chuck of the first embodiment, detachment of a substrate (for example, the wafer) can be facilitated.

In addition, the electrostatic chuck may further include a metal layer (for example, the metal layer 180) and an insulating film (for example, the insulating film 190). The metal layer may be configured to cover the end face of the wiring exposed from one surface of the ceramic plate. The insulating film may be configured to cover one surface of the ceramic plate and the metal layer, and to form an emboss (for example, the emboss 190a) at the position of the metal layer. Thereby, according to the electrostatic chuck of the first embodiment, the detachment of the substrate can be further facilitated.

In addition, the electrostatic chuck may further include a power supplying pad (for example, the power supplying pad 130) built-in near the other surface of the ceramic plate, electrically connected to the adsorption electrode via a wiring (for example, the wiring 140), and connected to a power supplying line (for example, the power supplying line 115). The ground electrode may be arranged in the ceramic plate at a position where a distance from the adsorption electrode is the same as that of the power supplying pad from the adsorption electrode. Thereby, according to the electrostatic chuck of the first embodiment, the manufacturing process of the electrostatic chuck can be simplified.

Further, the ground electrode may be connected to a ground line (for example, the ground line 116) that is switched between a state connected to the ground potential and a state not connected to the ground potential. Thereby, according to the electrostatic chuck of the first embodiment, the ground electrode can be connected to the ground potential when detaching the substrate from the adsorption surface, for example.

Second Embodiment

A second embodiment relates to variation in arrangement of the ground electrode 160 of the first embodiment.

Figure 4:
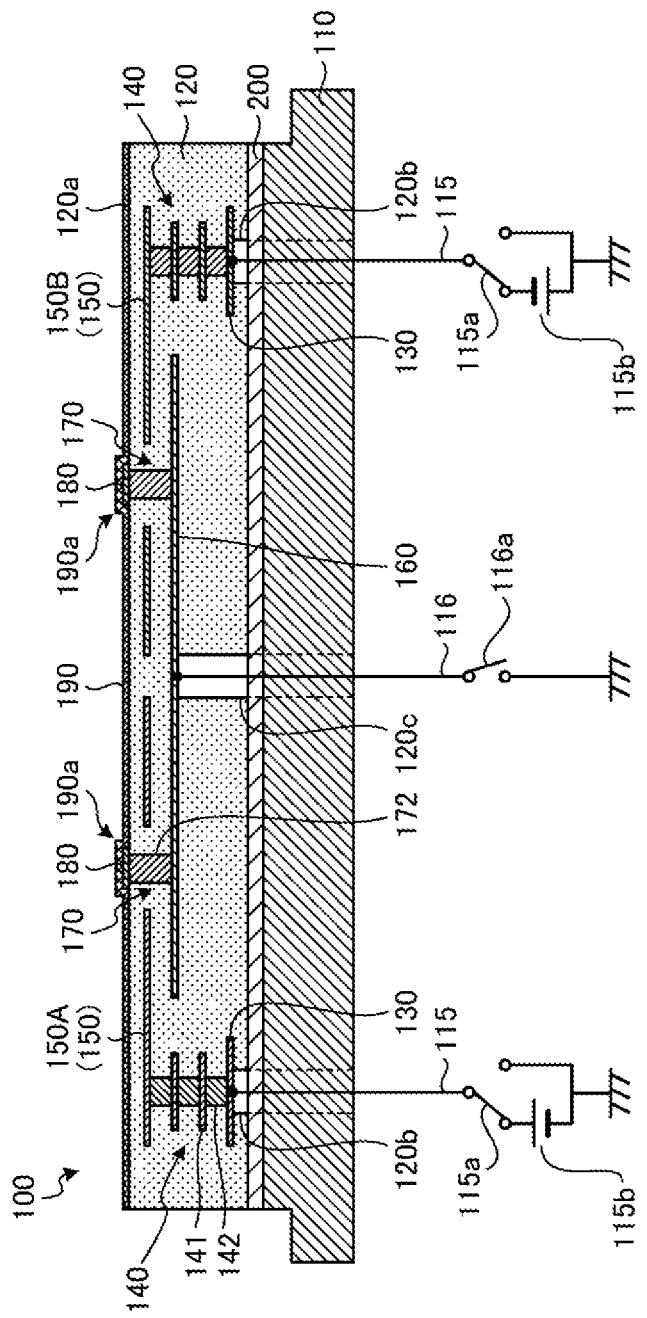
FIG. 4 is a schematic view showing a cross section of a substrate fixing device according to a second embodiment.

FIG. 4 is a schematic view showing a cross section of the substrate fixing device 100 according to the second embodiment. In FIG. 4, the same parts as those in FIG. 2 are denoted with the same reference signs. The ground electrode 160 shown in FIG. 4 is arranged at a position in the electrostatic chuck 120 where a distance from the adsorption electrode 150 is closer than that of the power supplying pad 130 from the adsorption electrode.

In the configuration shown in FIG. 4, the ground electrode 160 is arranged at a position where the distance from the adsorption electrode 150 is the same as that of the connection pad 141 of the layer closest to the adsorption electrode 150 from the adsorption electrode. The ground electrode 160 is arranged at the position close to the adsorption electrode 150, whereby the wiring 170 for connecting the ground electrode 160 and the adsorption surface 120a can be shortened. That is, in the configuration shown in FIG. 4, the wiring 170 does not have the connection pad 171 (refer to FIG. 2) and consists of only the via 172 connecting the ground electrode 160 and the adsorption surface 120a therebetween, and a length of the wiring 170 is short.

In this way, the ground electrode 160 is arranged at the position where the distance from the adsorption electrode 150 is closer than the distance of the power supplying pad 130 from the adsorption electrode, whereby the length of the wiring 170 for connecting the ground electrode 160 and the adsorption surface 120a is shortened. For this reason, when the application of the voltage to the adsorption electrode 150 is stopped, the electric charges remaining on the adsorption surface 120a can be promptly escaped to the ground electrode 160 via the short wiring 170. Thereby, according to the electrostatic chuck 120 of the second embodiment, it is possible to shorten a time after the application of the voltage to the adsorption electrode 150 is stopped until the substrate (for example, the wafer) is detached.

Third Embodiment

A third embodiment relates to variation in structure of the insulating film 190 of the first embodiment.

Figure 5:
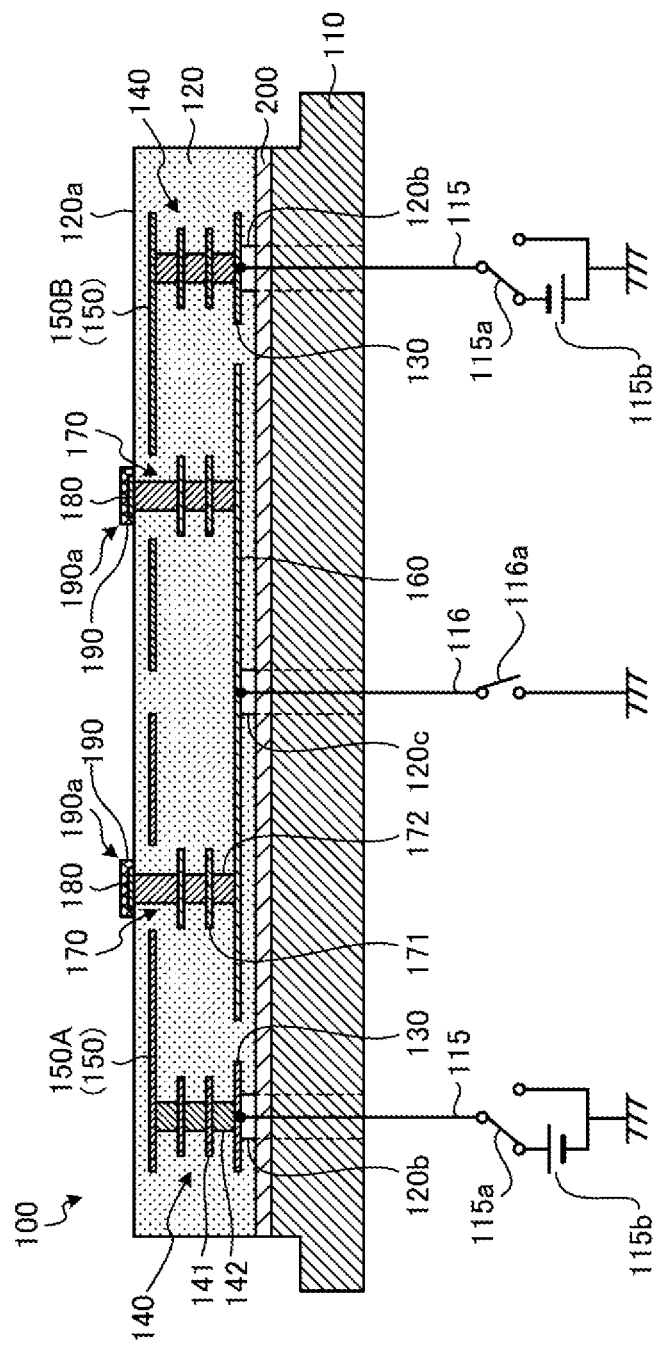
FIG. 5 is a schematic view showing a cross section of a substrate fixing device according to a third embodiment.

FIG. 5 is a schematic view showing a cross section of the substrate fixing device 100 according to the third embodiment. In FIG. 5, the same parts as those in FIG. 2 are denoted with the same reference signs. The insulating film 190 shown in FIG. 5 is configured to cover only the metal layer 180 and to form an emboss 190a protruding in a direction away from the adsorption surface 120a of the electrostatic chuck 120 at a position of the metal layer 180. The emboss 190a is formed by, for example, dropping an aluminum oxide paste to the position of the metal layer 180 and firing the same, and polishing the upper surface of the Obtained insulating film 190.

In this way, the insulating film 190 covers only the metal layer 180 and forms the emboss 190a at the position of the metal layer 180, whereby a contact area between the adsorption surface 120a and the wafer can be reduced. For this reason, it is possible to further reduce generation of the adsorption force between the adsorption surface 120a and the wafer due to electrification on the adsorption surface 120a. Thereby, according to the electrostatic chuck 120 of the third embodiment, the detachment of the substrate (for example, the wafer) from the adsorption surface 120a can be further facilitated. Further, according to the electrostatic chuck 120 of the third embodiment, since the covering range by the insulating film 190 can be reduced, as compared to the insulating film 190 in the first embodiment, a used amount of the material of the insulating film 190 can be reduced.

Fourth Embodiment

A fourth embodiment relates to variation in structure of the insulating film 190 and the adsorption surface 120a of the electrostatic chuck 120 of the first embodiment.

Figure 6:
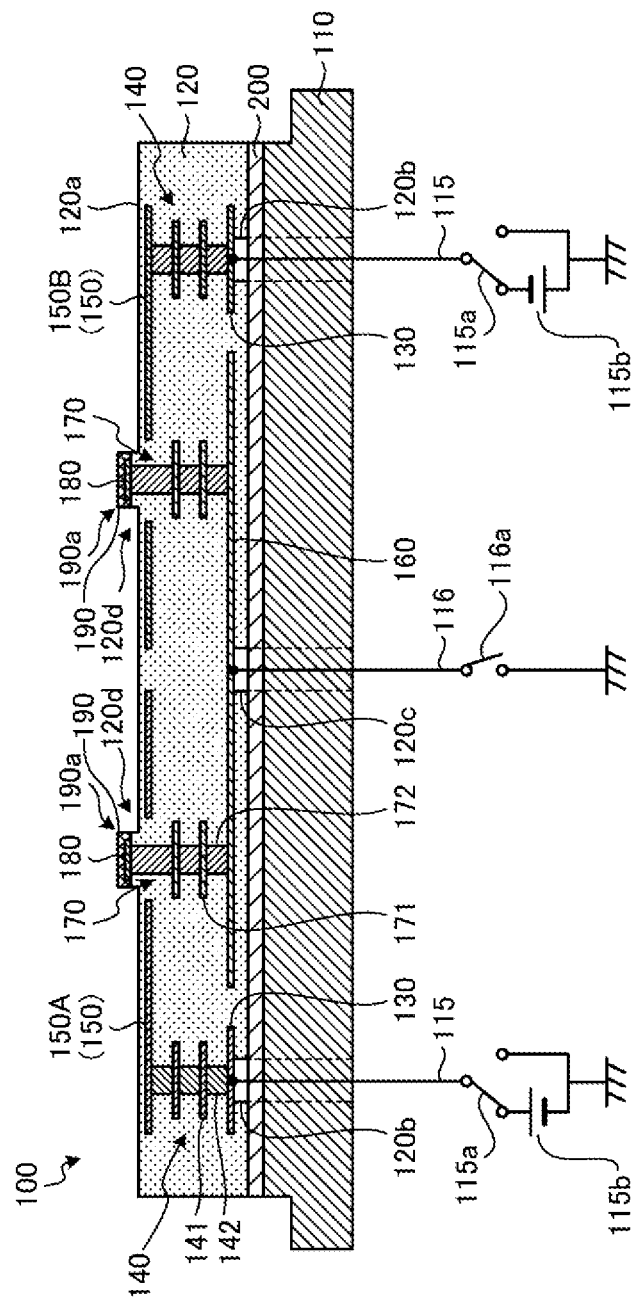
FIG. 6 is a schematic view showing a cross section of a substrate fixing device according to a fourth embodiment.

FIG. 6 is a schematic view showing a cross section of the substrate fixing device 100 according to the fourth embodiment. In FIG. 6, the same parts as those in FIG. 2 are denoted with the same reference signs. In the configuration shown in FIG. 6, the wiring 170 is arranged in two sets on the left and right according to the first electrode 150A and the second electrode 150B of the adsorption electrode 150. The end surfaces of the two wirings 170 are exposed from the adsorption surface 120a of the electrostatic chuck 120. The metal layer 180 is formed at each of the two positions of the adsorption surface 120a where the end surfaces of the two wirings 170 are exposed.

The insulating film 190 shown in FIG. 6 is configured to cover only the metal layer 180 at each of the two positions of the adsorption surface 120a where the end surfaces of the two wirings 170 are exposed. In addition, a step 120d is formed on the adsorption surface 120a and around the emboss 190a formed by the insulating film 190. The step 120d is formed by forming the insulating film 190 covering the adsorption surface 120a of the electrostatic chuck 120 and the surface of the metal layer 180, and then advancing blasting performed so as to form the emboss 190a to an inside of the electrostatic chuck 120.

In this way, the insulating film 190 covers only the metal layer 180, and the step 120d is formed on the adsorption surface 120a and around the emboss 190a formed by the insulating film 190, whereby a contact possibility between the adsorption surface 120a and the wafer can be reduced. As a result, according to the electrostatic chuck 120 of the fourth embodiment, it is possible to suppress generation of particles due to the contact between the adsorption surface 120a and the wafer.

Fifth Embodiment

A fifth embodiment relates to variation in structure of the insulating film 190 of the first embodiment.

Figure 7:
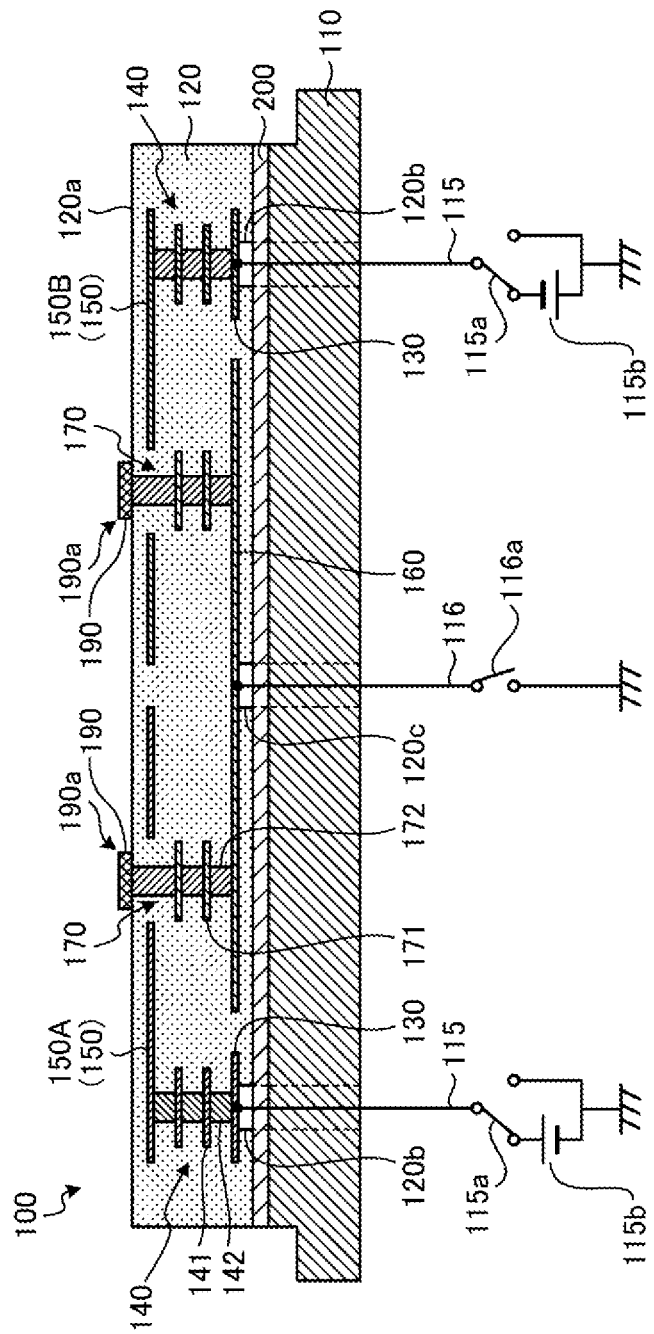
FIG. 7 is a schematic view showing a cross section of a substrate fixing device according to a fifth embodiment.

FIG. 7 is a schematic view showing a cross section of the substrate fixing device 100 according to the fifth embodiment. In FIG. 7, the same parts as those in FIG. 2 are denoted with the same reference signs. In the configuration shown in FIG. 7, the wiring 170 is arranged in two sets on the left and right according to the first electrode 150A and the second electrode 150B of the adsorption electrode 150. The end surfaces of the two wirings 170 are exposed from the adsorption surface 120a of the electrostatic chuck 120. In addition, the metal layer 180 (refer to FIG. 2) is not formed.

The insulating film 190 shown in FIG. 7 is formed at each of two positions where the end surfaces of the two wirings 170 are exposed from the adsorption surface 120a. The insulating film 190 is configured to cover only the end surfaces of the two wirings 170 exposed from the adsorption surface 120a, and to form an emboss 190a protruding away from the adsorption surface 120a of the electrostatic chuck 120 at the position of the end surface of each wiring 170. The emboss 190a is formed by, for example, dropping an aluminum oxide paste to the position of the end surface of each wiring 170 and firing the same, and polishing the upper surface of the obtained insulating film 190.

In this way, the insulating film 190 covers only the end surface of the wiring 170 and forms the emboss 190a at the position of the end surface of the wiring 170, whereby a contact area between the adsorption surface 120a and the wafer can be reduced. For this reason, it is possible to further reduce generation of the adsorption force between the adsorption surface 120a and the wafer due to electrification on the adsorption surface 120a. Thereby, according to the electrostatic chuck 120 of the fifth embodiment, the detachment of the substrate (for example, the wafer) from the adsorption surface 120a can be further facilitated. Further, according to the electrostatic chuck 120 of the fifth embodiment, the process of forming the metal layer 180 can be omitted, which can simplify the manufacturing process of the electrostatic chuck 120.

Sixth Embodiment

A sixth embodiment relates to variation in structure of the insulating film 190 of the first embodiment.

Figure 8:
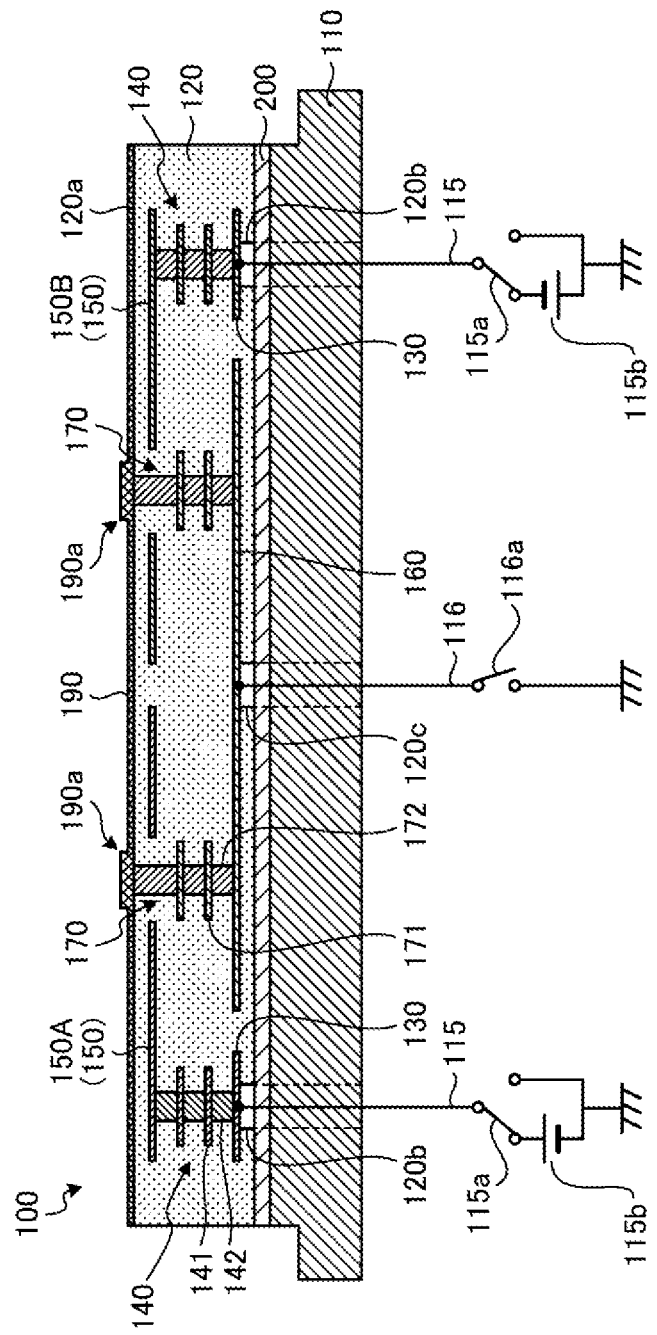
FIG. 8 is a schematic view showing a cross section of a substrate fixing device according to a sixth embodiment.

FIG. 8 is a schematic view showing a cross section of the substrate fixing device 100 according to the sixth embodiment. In FIG. 8, the same parts as those in FIG. 2 are denoted with the same reference signs. In the configuration shown in FIG. 8, the metal layer 180 (refer to FIG. 2) is not formed.

The insulating film 190 shown in FIG. 8 is configured to cover the adsorption surface 120a of the electrostatic chuck 120 and the end surface of the wiring 170 exposed from the adsorption surface 120a, and to form the emboss 190a at the position of the end surface of the wiring 170. The emboss 190a is formed by performing blasting on a region of the insulating film 190 that does not overlap the end surface of the wiring 170, after forming the insulating film 190 and polishing the upper surface of the insulating film 190. Note that, by advancing the blasting performed so as to form the emboss 190a to an inside of the electrostatic chuck 120, a step reaching the inside of the electrostatic chuck 120 may be formed around the emboss 190a.

In this way, the end surface of the wiring 170 exposed from the adsorption surface 120a is covered by the insulating film 190, and the insulating film 190 forms the emboss 190a at the position of the end surface of the wiring 170, whereby a contact area between the adsorption surface 120a and the wafer can be reduced. For this reason, it is possible to further reduce generation of the adsorption force between the adsorption surface 120a and the wafer due to electrification on the adsorption surface 120a. Thereby, according to the electrostatic chuck 120 of the sixth embodiment, the detachment of the wafer from the adsorption surface 120a can be further facilitated. Further, according to the electrostatic chuck 120 of the sixth embodiment, the process of forming the metal layer 180 can be omitted, which can simplify the manufacturing process of the electrostatic chuck 120.

Seventh Embodiment

A seventh embodiment relates to variation in structure of the metal layer 180 and the insulating film 190 of the first embodiment.

Figure 9:
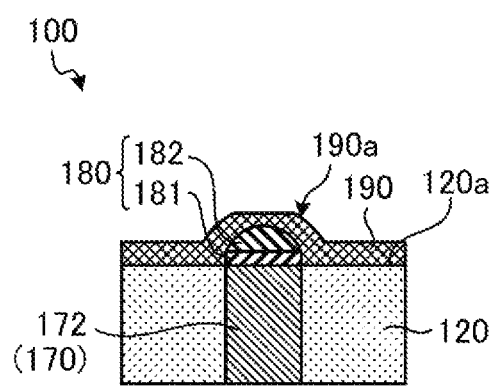
FIG. 9 is a schematic view showing a cross section of a substrate fixing device according to a seventh embodiment.

FIG. 9 is a schematic view showing a cross section of the substrate fixing device 100 according to the seventh embodiment. In FIG. 9, the vicinity of the adsorption surface 120a of the electrostatic chuck 120 is shown enlarged. In FIG. 9, the same parts as those in FIG. 2 are denoted with the same reference signs.

The metal layer 180 shown in FIG. 9 has a two-layered structure. Specifically, the metal layer 180 has a first metal layer 181 and a second metal layer 182.

The first metal layer 181 is configured to cover the end surface of the wiring 170 exposed from the adsorption surface 120a of the electrostatic chuck 120. The first metal layer 181 is formed by an electrolytic plating method or an electroless plating method using metal such as nickel or a nickel-gold alloy as a material.

The second metal layer 182 is laminated on the first metal layer 181, and an upper surface thereof protrudes in a spherical shape. The second metal layer 182 is formed by mounting a solder paste, a solder plating, or a solder ball on an upper surface of the first metal layer 181. The second metal layer 182 is melted and solidified by undergoing a reflow process, and protrudes upward in a spherical shape.

Note that, the second metal layer 182 may also be formed by applying a silver paste to the upper surface of the first metal layer 181. In this case, the second metal layer 182 is heated and cured by undergoing a thermal curing process, and protrudes upward in a spherical shape.

The insulating film 190 configured to cover the metal layer 180 having a two-layered structure has a flat surface at a top portion of the emboss 190a corresponding to a position of the second metal layer 182. The flat surface of the insulating film 190 is formed by polishing.

In this way, the metal layer 180 covered by the insulating film 190 has the two-layered structure, and the upper second metal layer 182 protrudes upward in a spherical shape, whereby the emboss 190a of the insulating film 190 can be formed into a tapered shape where a width decreases toward the top portion. For this reason, the contact area between the emboss 190a and the wafer can be reduced. Thereby, according to the electrostatic chuck 120 of the seventh embodiment, it is possible to suppress generation of particles due to the contact between the surface of emboss 190a and the wafer.

Further, since the insulating film 190 has the flat surface at the top portion of the emboss 190a corresponding to the position of the second metal layer 182, the contact area between the emboss 190a and the wafer can be further reduced. Thereby, according to the electrostatic chuck 120 of the seventh embodiment, it is possible to further suppress generation of particles due to the contact between the surface of emboss 190a and the wafer.

Eighth Embodiment

An eighth embodiment relates to variation in structure of the metal layer 80 and the insulating film 190 of the first embodiment.

Figure 10:
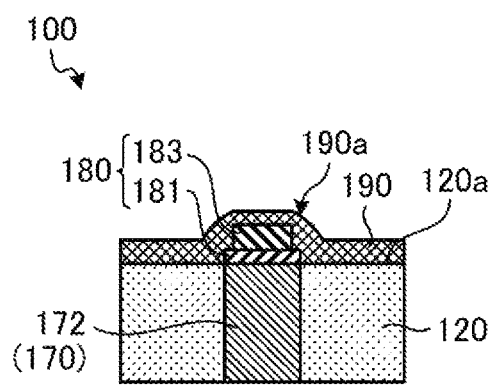
FIG. 10 is a schematic view showing a cross section of a substrate fixing device according to an eighth embodiment.

FIG. 10 is a schematic view showing a cross section of the substrate fixing device 100 according to the eighth embodiment. In FIG. 10, the vicinity of the adsorption surface 120a of the electrostatic chuck 190 is shown enlarged. In FIG. 10, the same parts as those in FIG. 2 are denoted with the same reference signs.

The metal layer 180 shown in FIG. 10 has a two-layered structure. Specifically, the metal layer 180 has a first metal layer 181 and a second metal layer 183.

The first metal layer 181 is configured to cover the end surface of the wiring 170 exposed from the adsorption surface 120a of the electrostatic chuck 120, The first metal layer 181 is formed by an electrolytic plating method or an electroless plating method using metal such as nickel or a nickel-gold alloy as a material.

The second metal layer 183 is laminated on the first metal layer 181 and has a width smaller than that of the first metal layer 181. When forming the second metal layer 183, for example, a protective tape is attached to an upper surface of the first metal layer 181 and the protective tape is patterned by laser processing to form an opening having a width smaller than that of the first metal layer 181 in the protective tape. Then, the second metal layer 183 of nickel, gold or the like is formed by an electrolytic plating method or an electroless plating method using the protective tape having the opening, as a plating mask. After the second metal layer 183 is formed, the protective tape is peeled off.

Note that, when forming the second metal layer 183, a photosensitive dry film may also be used instead of the protective tape. In this case, for example, a photosensitive dry film is laminated on the upper surface of the first metal layer 181 and the dry film is patterned by a photolithography method to form a resist layer having an opening having a width smaller than that of the first metal layer 181. Then, the second metal layer 183 of nickel, gold or the like is formed by an electrolytic plating method or an electroless plating method using the resist layer as a plating mask. After the second metal layer 183 is formed, the resist layer is removed by an alkaline stripping solution. Further, the second metal layer 183 may also be directly formed on the upper surface of the first metal layer 181 by a wire bump method.

The insulating film 190 configured to cover the metal layer 180 having a two-layered structure has a flat surface at a top portion of the emboss 190a corresponding to a position of the second metal layer 183. The flat surface of the insulating film 190 is formed by polishing.

In this way, the metal layer 180 covered by the insulating film 190 has the two-layered structure, and the width of the upper second metal layer 183 is smaller than the width of the first metal layer 181, whereby the emboss 190a of the insulating film 190 can be formed into a tapered shape where a width decreases toward the top portion. For this reason, the contact area between the emboss 190a and the wafer can be reduced. Thereby, according to the electrostatic chuck 120 of the eighth embodiment, it is possible to suppress generation of particles due to the contact between the surface of emboss 190a and the wafer.

Further, since the insulating film 190 has the flat surface at the top portion of the emboss 190a corresponding to the position of the second metal layer 183, the contact area between the emboss 190a and the wafer can be further reduced. Thereby, according to the electrostatic chuck 120 of the eighth embodiment, it is possible to further suppress generation of particles due to the contact between the surface of emboss 190a and the wafer.

(Others)

Figure 11:
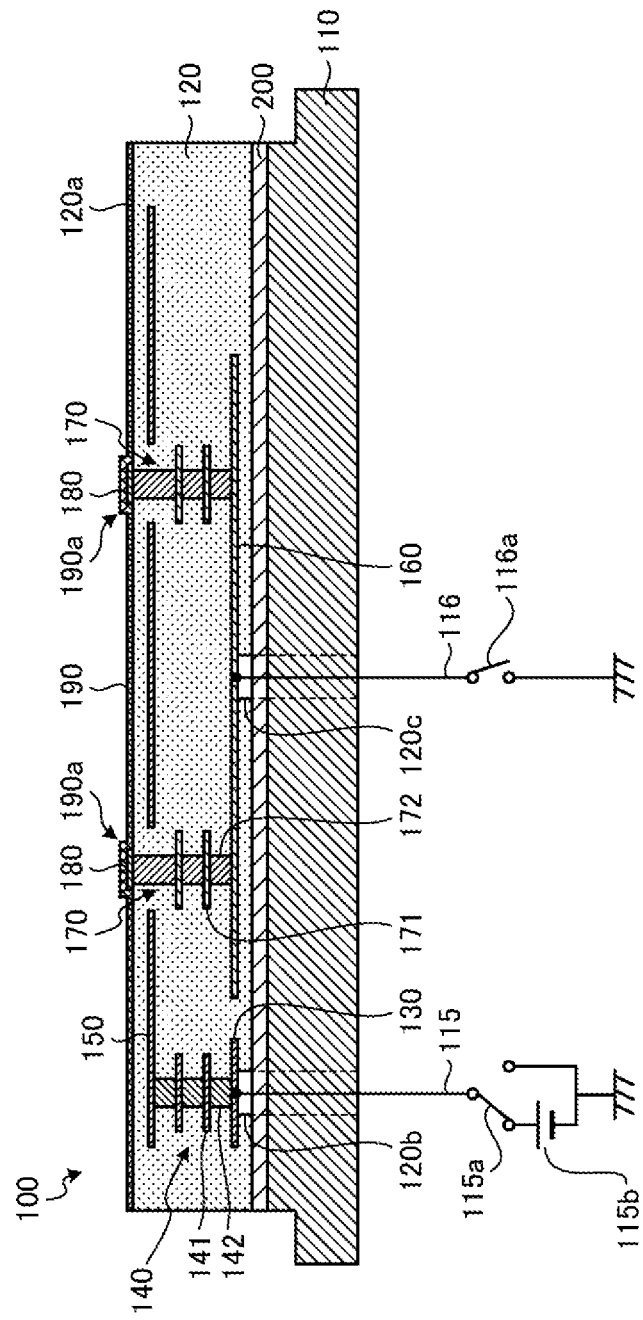
FIG. 11 shows a modified embodiment of a structure of an adsorption electrode.

In each of the above embodiments, the adsorption electrode 150 is a bipolar electrode, but the adsorption electrode 150 may also be a unipolar electrode. For example, as shown in FIG. 11, the adsorption electrode 150 may be formed from one disc-shaped conductor pattern that is not separated. FIG. 11 shows a modified embodiment of the structure of the adsorption electrode 150. In the configuration shown in FIG. 11, the power supplying pad 130 and the wiring 140 are arranged in one set for the adsorption electrode 150.

Even when the adsorption electrode 150 is a unipolar electrode, since the ground electrode 160 is arranged in the electrostatic chuck 120 and the wiring 170 is connected to the ground electrode 160, the electric charges on the adsorption surface 120a can be escaped to the ground electrode 160 via the wiring 170.

In addition, in each of the above embodiments, the insulating film 190 that covers the metal layer 180 or the insulating film 190 that covers the end surface of the wiring 170 is formed. However, the insulating film 190 that covers the metal layer 180 and the insulating film 190 that covers the end surface of the wiring 170 may also be mixed.

In addition, as a variation in structure of the insulating film 190 of the fourth embodiment shown in FIG. 6, for example, as shown in FIG. 12, the insulating film 190 may be formed at each of the two positions of the adsorption surface 120*a* where the end surfaces of the two wirings 170 are exposed. The insulating layer may be configured to cover only the end surfaces of the two wirings 170 without the metal layer 180.

What is claimed is:

1. An electrostatic chuck comprising:
    a ceramic plate;
    an adsorption electrode built-in near one surface of the ceramic plate;
    a ground electrode arranged in the ceramic plate between the other surface of the ceramic plate and the adsorption electrode and connectable to a ground potential;
    a wiring connected to the ground electrode in the ceramic plate and extending to the one surface of the ceramic plate;
    a metal layer configured to cover an end surface of the wiring exposed from the one surface of the ceramic plate; and
    an insulating film configured to cover the one surface of the ceramic plate and the metal layer or only the metal layer and to form an emboss at a position of the metal layer.

2. The electrostatic chuck according to claim 1, wherein the metal layer comprises:
    a first metal layer configured to cover the end surface of the wiring exposed from the one surface of the ceramic plate, and
    a second metal layer laminated on the first metal layer, a surface of the second metal layer distant from the first metal layer protruding in a spherical shape.

3. The electrostatic chuck according to claim 1, wherein the metal layer comprises:
    a first metal layer configured to cover the end surface of the wiring exposed from the one surface of the ceramic plate, and
    a second metal layer laminated on the first metal layer and having a width smaller than that of the first metal layer.

4. The electrostatic chuck according to claim 2, wherein the insulating film has a flat surface on a top portion of the emboss corresponding to a position of the second metal layer.

5. The electrostatic chuck according to claim 1, comprising:
    a plurality of the wirings,
    wherein the metal layer is formed at each of a plurality of positions of the one surface of the ceramic plate where end surfaces of the plurality of wirings are exposed,
    wherein the insulating film is configured to cover only the metal layer at each of the plurality of positions, and
    wherein the one surface of the ceramic plate has a step formed around the emboss formed by the insulating film.

6. An electrostatic chuck comprising:
    a ceramic plate;
    an adsorption electrode built-in near one surface of the ceramic plate;
    a ground electrode arranged in the ceramic plate between the other surface of the ceramic plate and the adsorption electrode and connectable to a ground potential;
    a wiring connected to the ground electrode in the ceramic plate and extending to the one surface of the ceramic plate; and
    an insulating film configured to cover the one surface of the ceramic plate and an end surface of the wiring exposed from the one surface of the ceramic plate or only the end surface of the wiring exposed from the one surface of the ceramic plate, and to form an emboss at a position of the end surface of the wiring.

7. The electrostatic chuck according to claim 6, comprising:
    a plurality of the wirings,
    wherein the insulating film is formed at each of a plurality of positions of the one surface of the ceramic plate where end surfaces of the plurality of wirings are exposed, and is configured to cover only the end surfaces of the plurality of wirings, and
    wherein the one surface of the ceramic plate has a step formed around the emboss formed by the insulating film.

8. An electrostatic chuck comprising:
    a ceramic plate;
    an adsorption electrode built-in near one surface of the ceramic plate;
    a ground electrode arranged in the ceramic plate between the other surface of the ceramic plate and the adsorption electrode and connectable to a ground potential;
    a wiring connected to the ground electrode in the ceramic plate and extending to the one surface of the ceramic plate; and
    a power supplying pad built-in near the other surface of the ceramic plate, electrically connected to the adsorption electrode via a wiring and connected to a power supplying line,
    wherein the ground electrode is arranged at a position in the ceramic plate where a distance from the adsorption electrode is the same as that of the power supplying pad from the adsorption electrode.

9. An electrostatic chuck comprising:
    a ceramic plate;
    an adsorption electrode built-in near one surface of the ceramic plate;
    a ground electrode arranged in the ceramic plate between the other surface of the ceramic plate and the adsorption electrode and connectable to a ground potential;
    a wiring connected to the ground electrode in the ceramic plate and extending to the one surface of the ceramic plate; and
    a power supplying pad built-in near the other surface of the ceramic plate, electrically connected to the adsorption electrode via a wiring and connected to a power supplying line,
    wherein the ground electrode is arranged at a position in the ceramic plate where a distance from the adsorption electrode is closer than that of the power supplying pad from the adsorption electrode.

10. The electrostatic chuck according to claim 1, wherein the ground electrode is connected to a ground line that is switched between a state connected to the ground potential and a state not connected to the ground potential.

11. A substrate fixing device comprising:
    a base plate; and
    an electrostatic chuck fixed to the base plate and configured to adsorb a substrate by an electrostatic force, wherein the electrostatic chuck comprises:
- a ceramic plate;
- an adsorption electrode built-in near one surface of the ceramic plate on which the substrate is adsorbed;
- a ground electrode arranged in the ceramic plate between the other surface of the ceramic plate and the adsorption electrode and connectable to a ground potential;
- a wiring connected to the ground electrode in the ceramic plate and extending to the one surface of the ceramic plate;
- a metal layer configured to cover an end surface of the wiring exposed from the one surface of the ceramic plate; and
- an insulating film configured to cover the one surface of the ceramic plate and the metal layer or only the metal layer and to form an emboss at a position of the metal layer.

12. The electrostatic chuck according to claim 1, wherein, viewing the electrostatic chuck in plan view facing the one surface of the ceramic plate, the adsorption electrode and the wiring are disposed at non-overlapping separated positions.

13. The substrate fixing device according to claim 11, wherein, viewing the electrostatic chuck in plan view facing the one surface of the ceramic plate, the adsorption electrode and the wiring are disposed at non-overlapping separated positions.

* * * * *